(12) United States Patent
Lam

(10) Patent No.: US 6,504,725 B1
(45) Date of Patent: Jan. 7, 2003

(54) TOPOLOGY FOR PCI BUS RISER CARD SYSTEM

(75) Inventor: Don T. Lam, Fountain Valley, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/727,048

(22) Filed: Nov. 29, 2000

(51) Int. Cl.[7] .................................................. H05K 12/16
(52) U.S. Cl. ........................ 361/785; 361/761; 361/788; 361/803; 361/737; 439/61; 439/65
(58) Field of Search ................................. 361/785, 788, 361/790, 803, 675, 720, 761, 737, 748; 434/61, 62, 55, 170, 630, 74, 75

(56) References Cited

U.S. PATENT DOCUMENTS

| | | | | |
|---|---|---|---|---|
| 4,683,550 A | * | 7/1987 | Jindrick et al. | ............. 361/683 |
| 4,885,482 A | * | 12/1989 | Sharp et al. | .................. 326/47 |
| 5,440,755 A | * | 8/1995 | Harwer et al. | ............... 710/105 |
| 5,754,796 A | * | 5/1998 | Wang et al. | ................... 439/74 |
| 6,146,150 A | * | 11/2000 | Roberts | ........................ 439/55 |
| 6,241,530 B1 | * | 6/2001 | Eddy et al. | .................... 439/61 |

\* cited by examiner

*Primary Examiner*—David Martin
*Assistant Examiner*—Hung Bui
(74) *Attorney, Agent, or Firm*—Blakely, Sokoloff, Taylor & Zafman LLP

(57) ABSTRACT

The present invention provides a compact riser card system which provides two or more PCI connectors to couple one or more peripheral boards to a PCI bus on a computer board while satisfying the height requirements for 1U systems. In one embodiment, this invention provides two 64-bit connectors on two riser cards coupled to a single connector on a 66 MHz PCI bus.

36 Claims, 13 Drawing Sheets

| TRACE | SOURCE → DESTINATION | MAX LENGTH | MIN / MAX LENGTH |
|---|---|---|---|
| E | BASEBOARD CONN. → PCI CONN. | <= 1.4 inches | 0.3 – 1.1 inches |
| I | TRACE LENGTH ON DEVICE A | <= 2.0 inches | 1.0 – 2.0 inches |

| TRACE | SOURCE → DESTINATION | MAX LENGTH | MIN / MAX LENGTH |
|---|---|---|---|
| F | BASEBOARD CONN. → INTERBOARD CONN. | <= 2.0 inches | 1.0 – 1.7 inches |
| G | INTERBOARD CONN. → PCI CONN. | <= 1.9 inches | 0.2 – 1.6 inches |
| I | TRACE LENGTH ON DEVICE A | <= 2.0 inches | 1.0 – 2.0 inches |

| TRACE | SOURCE → DESTINATION | MAX LENGTH | MIN / MAX LENGTH |
|---|---|---|---|
| E | BASEBOARD CONN. → PCI CONN. 1 | <= 1.4 inches | 0.3 – 1.1 inches |
| F | PCI CONN. 1 → INTERBOARD CONN. | <= 1.5 inches | 0.8 – 1.2 inches |
| G | INTERBOARD CONN. → PCI CONN. 2 | <= 1.9 inches | 0.2 – 1.6 inches |
| I | TRACE LENGTHS ON DEVICES A & B | <= 2.0 inches | 1.0 – 2.0 inches |

| TRACE | SOURCE → DESTINATION | MAX LENGTH | MIN / MAX LENGTH |
|---|---|---|---|
| A | PCI DEVICE. → T POINT | <= 1.2 inches | 0.01 – 1.0 inches |
| B | HOST BRIDGE → T POINT. | <= 1.2 inches | 0.01 – 1.0 inches |
| C | T POINT → ATTENUATION RESISTOR | <= 6 inches | 2.0 – 5.0 inches |
| D | ATT. RESISTOR → BASEBOARD CONN. | <= 2.5 inches | 1.0 – 2.0 inches |
| H | PULL-UP RESISTOR STUB LENGTH | <= 1.2 inches | 0.01- 1.0 inches |

TOPOLOGY FOR PCI BUS RISER CARD SYSTEM

FIELD

This invention relates to a riser card topology for computer boards and, more particularly to a 66 MHz PCI bus riser card system capable of coupling one or more peripheral boards to a PCI bus.

GENERAL BACKGROUND

As computer systems evolve, there is an increasing need to provide more components, such as semiconductor devices, connectors, memory, etc., per square inch of board space. In some applications, such as web servers, part of this need has been addressed by employing a plurality of chassis arranged within a rack. A chassis is a device designed to house or hold a computer board or circuit board. A plurality of chassis may then be closely arranged or stacked in a rack, which is often a cabinet-like structure. The rack provides a common bus on to which the computer boards may be connected for operation.

In order to provide certain design standards, chassis enclosures are specified as 1U, 2U, etc. "1U" defines a chassis that can house a circuit board no more than 1.75 inches high. "1U" systems are often deployed in data centers and host service provider sites to achieve maximum performance density. "2U" is defined as "2×1U" or 3.5 inches, and so on. As a consequence, these units of separation define the maximum height of computer boards, including all components and peripheral cards that can be deployed in such chassis.

One way in which such performance density is achieved is by minimizing the number of connectors or sockets that are mounted on a board. However, this also limits the number of cards that may be connected onto the board.

A significant problem also exists as a result of the limited spacing between each computer board. For instance, in a 1U system, a mere 1.75 inches in height are available to fit memory modules and peripheral cards. Because many connectors and sockets on a computer board are mounted vertical to the surface of the board, this prevents installing many peripheral cards as they would protrude beyond 1.75 inches in height.

One solution to this problem is to use a riser card which permits installation of peripheral cards in a horizontal position to the computer board. Generally, a "riser card" is a module which couples to an existing connector or socket on the computer board and includes one or more connectors on the module onto which peripheral devices may be coupled. By making a riser card compact and mounting the connectors thereon in a horizontal position to the computer board, peripheral cards may be coupled to the riser card so as to fit within the 1.75-inch constraint of 1U systems.

One common connector for peripheral cards is a Peripheral Component Interconnect (PCI) socket. The PCI bus was proposed by Intel Corporation as a solution to provide a high-speed expansion bus standard. The original PCI bus standard has been upgraded several times, with the current standard being Revision 2.2, available from a trade association group referred to as PCI Special Interest Group, 5440 Westgate Drive, Suite 217, Portland, Oreg. 97221; also found at www.pcisig.com. The PCI Specification, Rev. 2.2, is incorporated herein by reference. The PCI bus provides for 32-bit or 64-bit transfers at 33 MegaHertz (MHz) or 66 MHz. It can be populated with peripheral cards, including adapters, requiring fast access to each other and/or with system memory, and can be accessed by the host processor at speeds approaching that of the processor's native bus speed. A 64-bit, 66 MHz PCI bus has a theoretical maximum transfer rate of 528 MegaBytes/sec.

As the demand for faster computers has grown, the 66 MHz PCI bus has become common in computer systems. One consideration in the design of computer boards employing the 66 MHz PCI bus standard is signal reflection. Signal reflection occurs where a transmission signal crosses from a first transmission medium to a second transmission medium having different characteristic impedances. For instance, this is the case where a connector electrically couples a PCI bus to a peripheral card. Another source of reflection is where a single transmission path splits into two or more transmission paths.

Thus, the addition of connectors and riser cards between onboard devices and PCI devices on peripheral cards causes a major signal quality problem on the 66 MHz PCI bus. As transmission frequencies increase, the disruption of signal waveforms caused by such reflection becomes increasingly problematic. Hence, in designing a computer board that includes a 66 MHz bus, transmission paths, including the sockets, riser cards, and peripheral cards, must be carefully considered in order to minimize signal reflection.

Accordingly, there is a need for a compact riser card system which will provide two or more 64-bit PCI sockets to couple one or more peripheral boards to a 66 MHz PCI bus on a computer board while satisfying the height requirements for 1U systems.

DETAILED DESCRIPTION OF THE INVENTION

Figure 1:
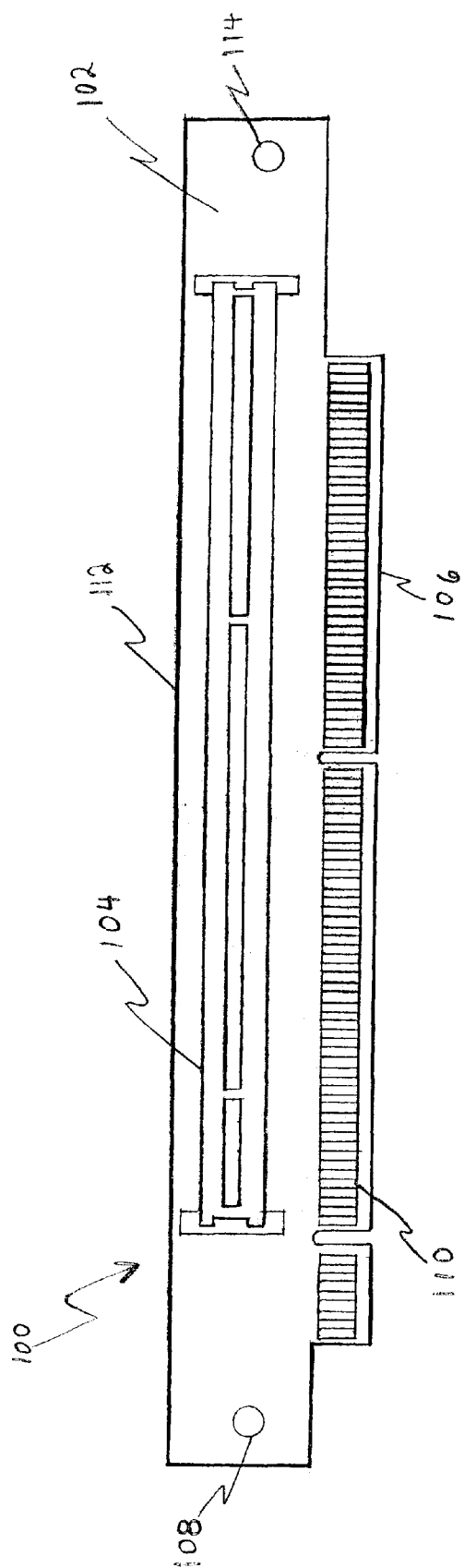
FIG. 1 is a front view of an exemplary embodiment of a primary riser card.

FIG. 1 illustrates a front view of an exemplary embodiment of a primary riser card 100. A "primary riser card" is defined as a riser card substrate 102 having a connecting edge 106 to couple to a socket or baseboard connector. In one embodiment, the connecting edge 106 of the primary riser card 100 may be designed to couple to a PCI socket. The connecting edge 106 may comply with the PCI standard specification and may include one or more electrical contacts 110 to electrically couple the primary riser card 100 to a PCI bus. In one embodiment of the invention, the distance between the connecting edge 106 and opposite edge 112 of the primary riser card is in the range of 0.25 inches to 1.75 inches. This is so that the primary riser card 100 will fit within the physical constraints of a 1U system. According to a second embodiment, the primary riser card 100 is approximately one (1) inch high.

According to one embodiment of the invention, the primary riser card 100 may include one or more sockets 104 which may be electrically coupled to one or more of the electrical contacts 110. The term "socket", as used throughout this document, is defined to be synonymous and interchangeable with the term "connector". In one embodiment, the one or more sockets 104 may be either 64-bit or 32-bit PCI sockets. The one or more sockets 104 may be mounted either on the front or back surface of the primary riser card substrate 102 so that it is substantially horizontal to the computer board on to which the primary riser card 100 may be coupled.

Figure 2:
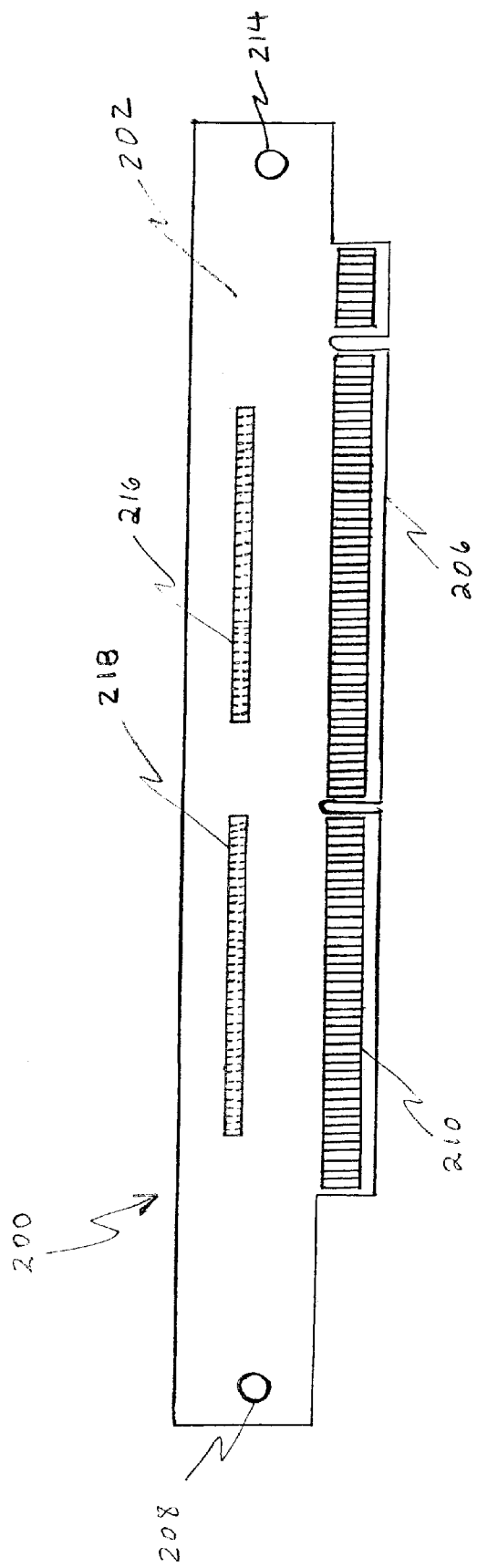
FIG. 2 is a back view of an exemplary embodiment of a primary riser card.

FIG. 2 illustrates the back view of an exemplary embodiment of a primary riser card 200. According to this embodiment, one or more interboard connectors 216 and 218 may be mounted on a surface of the primary card substrate 202. These one or more interboard connectors 216 and 218 may also be mounted on the same surface or opposite surface as the socket 104 of the primary riser card 100 of FIG. 1.

According to another embodiment, the one or more interboard connectors 216 and 218 may be coupled to one or more electrical contacts 210 on a primary riser card 200. In another embodiment, the connectors may be electrically coupled to the one or more sockets 104 in FIG. 1. These one or more connectors 216 and 218, alone or in combination, may be capable of providing all signals of a PCI bus including the address lines, data lines, clock, and configuration lines. In one such embodiment, the one or more interboard connectors 216 and 218 may provide the signals for a 66 MHz PCI bus. In one configuration, the one or more interboard connectors 216 and 218 may include a second PCI socket.

Figure 3A:
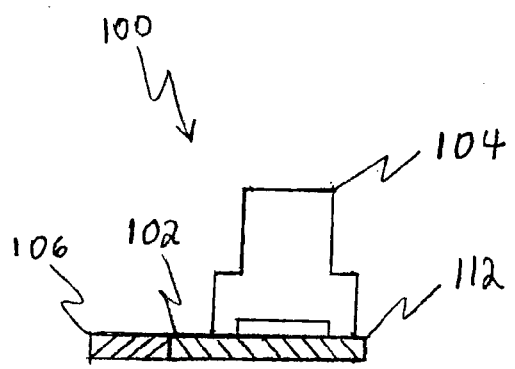
FIG. 3A is a side view of an exemplary embodiment of the primary riser card of FIG. 1.

FIG. 3A illustrates a side view of the primary riser card 100 of FIG. 1. The one or more sockets 104 are mounted on a first surface of the primary riser card substrate 102 in such a manner that when the primary riser card 100 is coupled to a baseboard connector on a computer board, the combined structure does not exceed 1.75 inches in height. This allows a first peripheral card to be coupled to the primary riser card's one or more sockets 104.

Figure 3B:
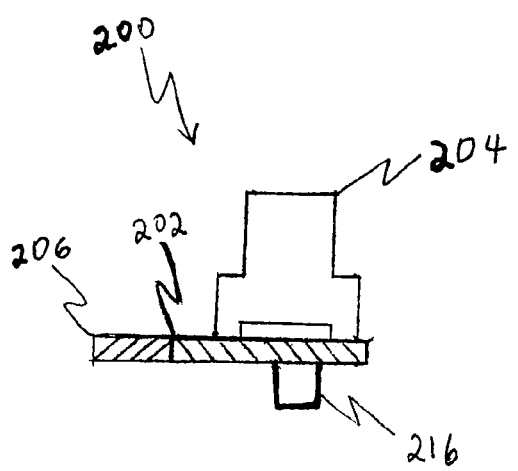
FIG. 3B is a side view of an exemplary embodiment of the primary riser card of FIG. 2.

FIG. 3B illustrates a side view of an exemplary primary riser card 200 incorporating the one or more interboard connectors 216 and 218 (not shown) of FIG. 2. These interboard connectors 216 and 218 may serve to couple a second peripheral card to the same PCI bus as a first peripheral card which may be coupled to the one or more sockets 204 on the primary riser card 200. According to another embodiment, the connectors 216 and 218 may serve to couple to a secondary riser card. In a first embodiment, the one or more interboard connectors 216 and 218 may be a single 64-bit PCI socket. In other embodiments, the one or more connectors 216 and 218 may be a set of two 90-pin connectors or three 60-pin connectors.

Figure 4:
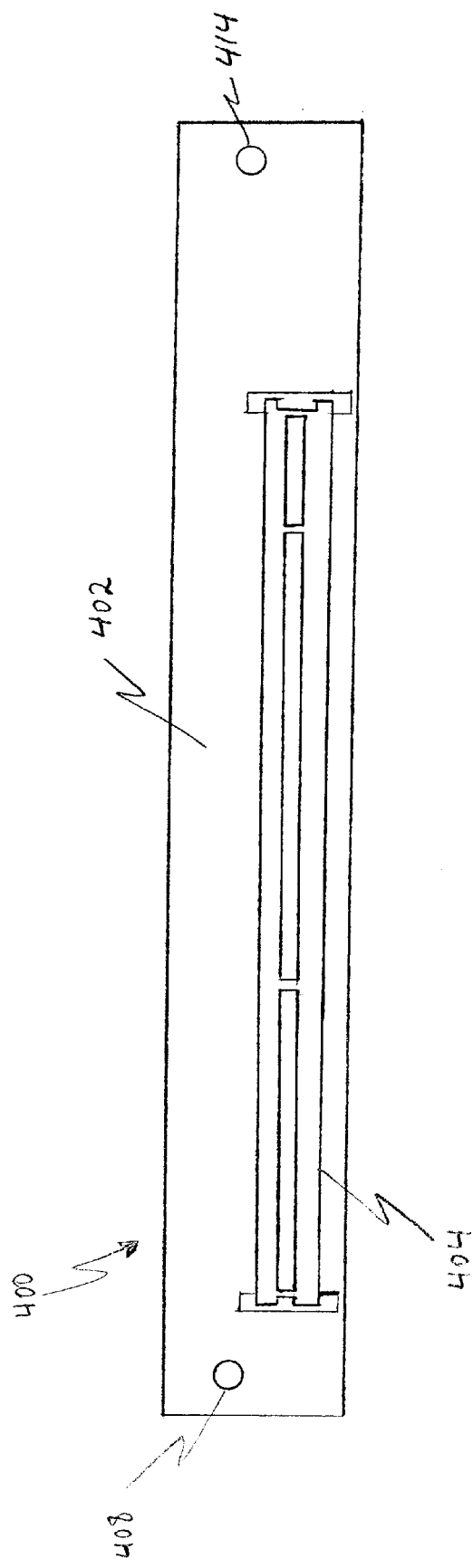
FIG. 4 is a front view of an exemplary embodiment of a secondary riser card.

FIG. 4 illustrates a front view of an exemplary embodiment of a secondary riser card 400. Generally, a "secondary riser card" 400 is defined as a riser card substrate 402 having a socket 404 to couple to a peripheral card, and may be removably coupled to a primary riser card. Secondary riser cards are useful to allow two or more peripheral cards to electrically couple to a single socket on a computer board. In one embodiment, the socket on the secondary riser card 400 is a 64-bit PCI socket.

Figure 5:
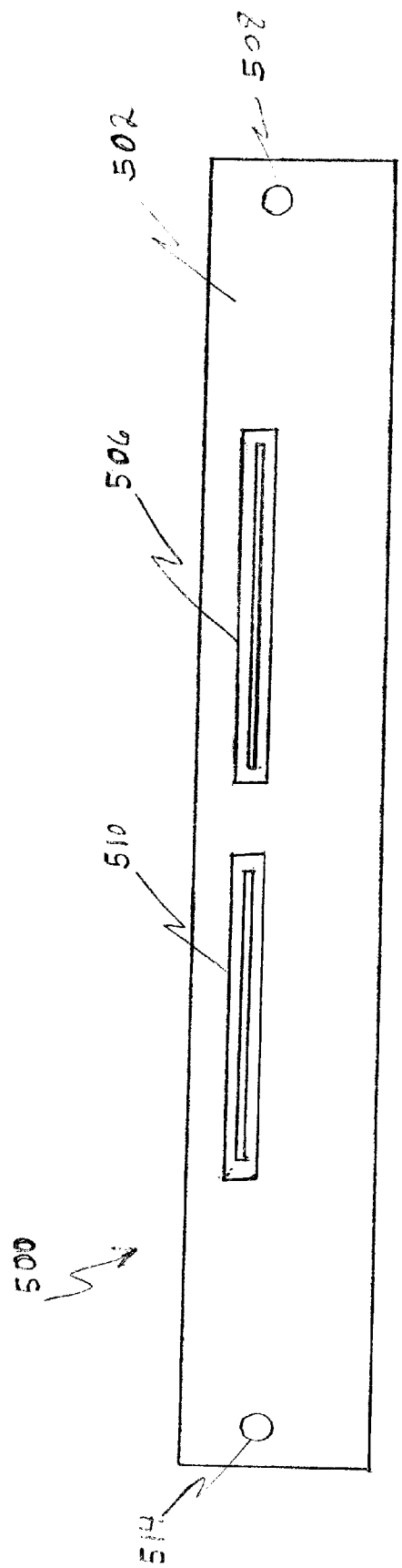
FIG. 5 is a back view of an exemplary embodiment of a secondary riser card.

FIG. 5 illustrates the back view of one embodiment of a secondary riser card 500. The secondary riser card 500, in addition to the socket 404 of FIG. 4, may include one or more connectors 506 and 510 for electrically coupling to a primary riser card. In various embodiments of the secondary riser card 500, the one or more interboard connectors 506 and 510 may be mounted on the same or opposite surface as the socket 404 (in FIG. 4).

Figure 6:
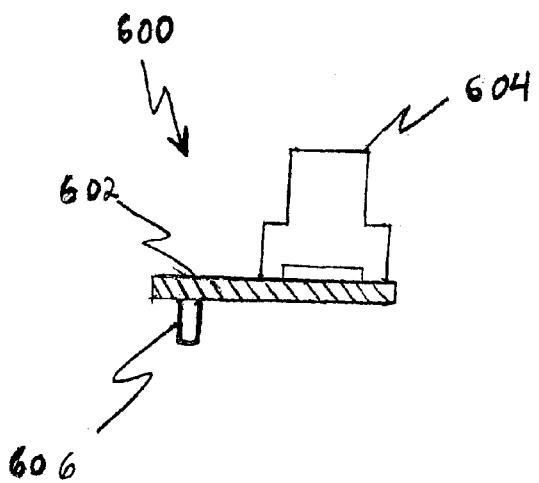
FIG. 6 is a side view of an exemplary embodiment of a secondary riser card.

FIG. 6 illustrates a side view of a secondary riser card 600 configuration. In this configuration, the secondary riser card substrate 602 has a PCI socket 604 mounted on a first surface and at least one interboard connector 606 mounted on a second surface. According to one embodiment, the width of the secondary riser card 600 is in the range of 0.25 inches to 1.75 inches so that the secondary riser card 600 will fit within the physical constraints of a 1U system. In another embodiment, the secondary riser card may have a PCI socket and the one or more connectors mounted on the same surface of the substrate.

Figure 7A:
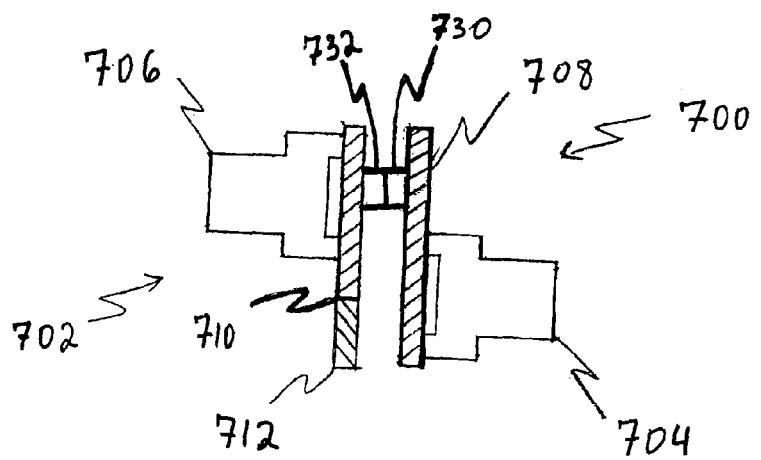
FIG. 7A is a side view of an exemplary embodiment of the interconnection of a primary riser card and a secondary riser card.

FIG. 7A illustrates a side view of the interconnection of a primary riser card 702 and a secondary riser card 700. This configuration comprises of a primary riser card 702, including a substrate 710, a socket 706, and one or more interboard connectors 732, coupled to a secondary riser card 700, including a substrate 708, a socket 704, and one or more interboard connectors 730. The riser cards being electrically coupled via the interboard connectors 730 and 732. This side view also illustrates that in one embodiment the primary and secondary riser cards 702 and 700 may be of approximately the same height. According one configuration, these riser cards are less than 1.75 inches high.

A connecting edge 712 on the primary riser card substrate 710 is provided to electrically couple the assembly 700 and 702 to a circuit board or computer board. According to one embodiment, the socket 704 on the secondary riser card 700 may be electrically coupled to the connecting edge 712 on the primary riser card 702.

In one embodiment, the sockets 704 and 706 may be any combination of 32-bit and 64-bit PCI sockets. Such configuration would allow at least two peripheral cards to couple to a single PCI socket on a computer board while fitting within the physical constraints of a 1U system. In one configuration, the sockets 704 and 706 mounted on the primary and secondary riser cards are 64-bit PCI sockets.

Figure 7B:
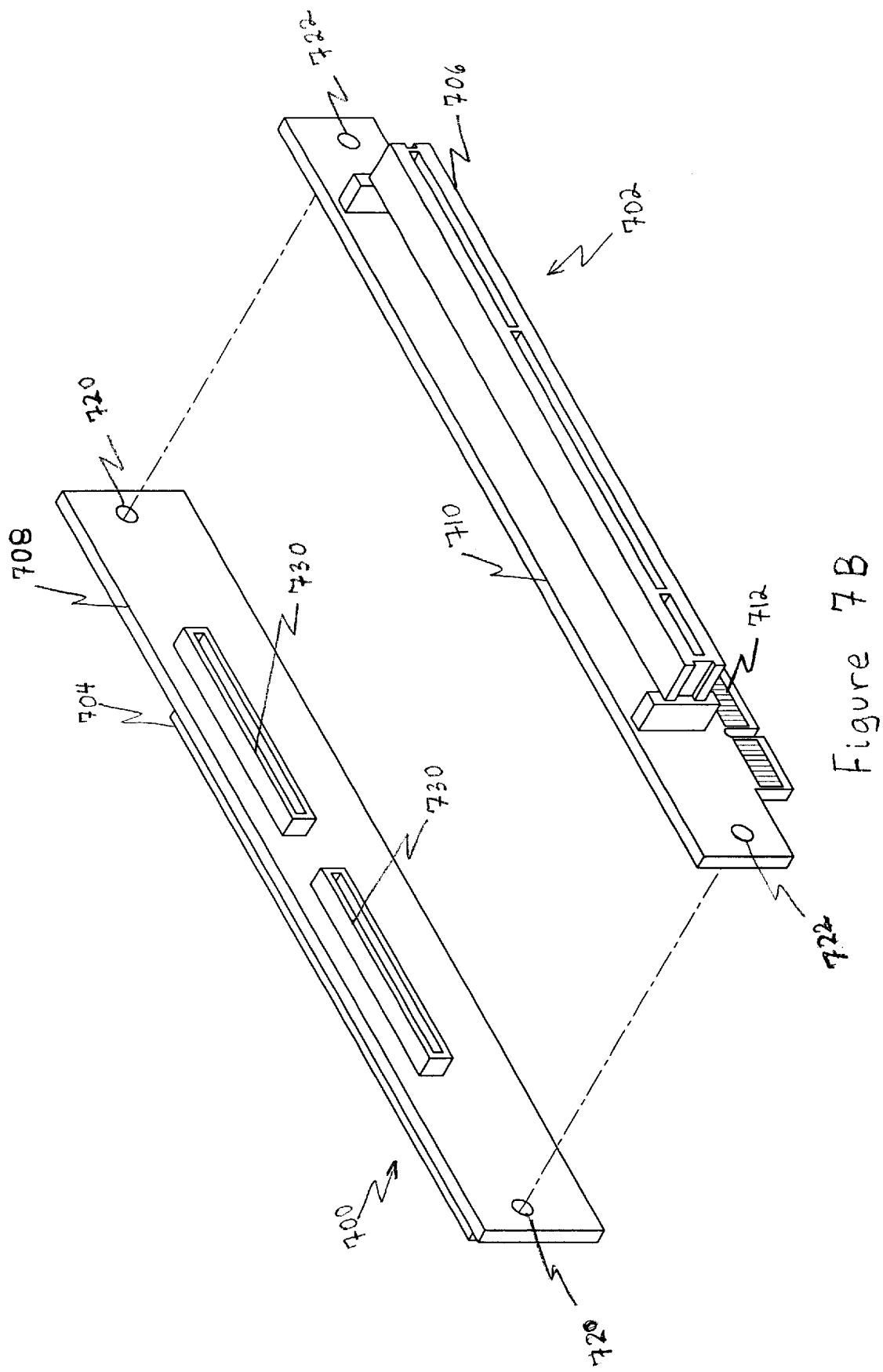
FIG. 7B is a first exploded perspective view of an exemplary embodiment of the interconnection of the primary and secondary riser cards shown in FIG. 7A.

FIG. 7B illustrates a first exploded perspective view of one embodiment of the primary and secondary riser cards of FIG. 7A. As shown, the primary riser card 702, which includes a substrate 710, a socket 706, and a connecting edge 712, may be coupled to a secondary riser card 700, which includes a substrate 708, a socket 704, and one or more interboard connectors 730.

Figure 7C:
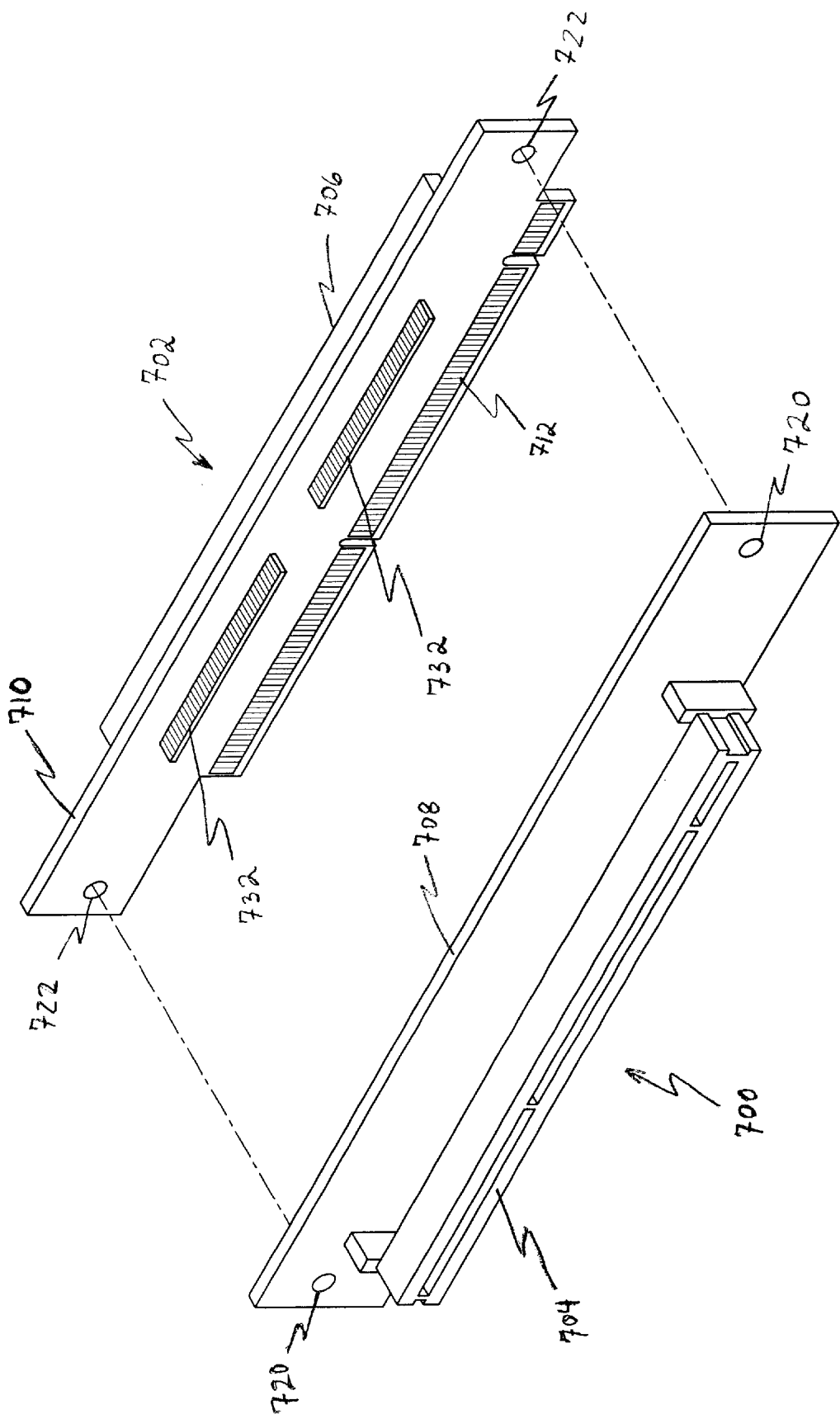
FIG. 7C is a second exploded perspective view of an exemplary embodiment of the interconnection of the primary and secondary riser cards shown in FIG. 7A.

FIG. 7C illustrates a second exploded perspective view of the embodiment shown in FIG. 7A. As shown, the primary riser card 702 includes one or more interboard connectors 732 to couple to the interboard connectors 730 (in FIG. 7B) of the secondary riser card 700. Additionally, the primary and secondary riser cards 702 and 700 may also include one or more holes 720 and 722 through which a retaining mechanism or fastener may fit to secure the two cards 700 and 702.

One of the challenges of designing the riser cards described above to operate with a 66 MHz PCI bus is choosing transmission paths along the bus and interfacing components which will minimize signal reflection and meet the PCI revision 2.2 timing specifications. Through simulations and empirical testing, it has been discovered that a particular set of trace or signal path lengths accomplishes these goals.

Figures 8A, 8B:
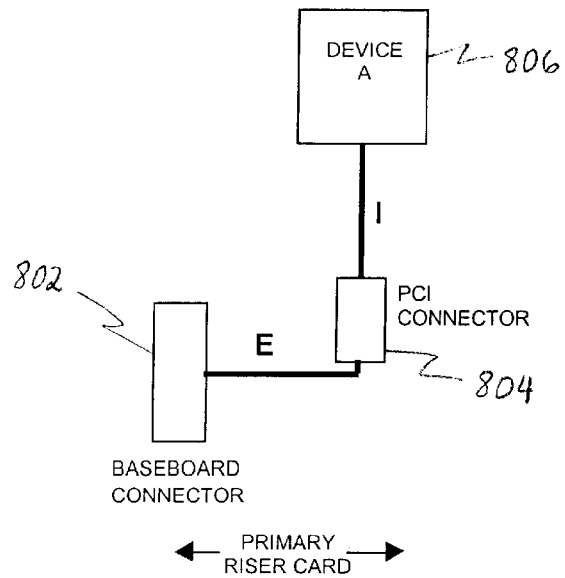
FIG. 8A illustrates a configuration of the primary riser card of FIG. 1.
FIG. 8B presents a set of trace lengths for the configuration shown in FIG. 8A.

FIG. 8A illustrates the signal transmission paths or traces for a PCI bus from a baseboard connector 802 or PCI socket on a computer board through a primary riser card and a peripheral card 806 coupled to the primary riser card. According to one embodiment of the invention, the signal path from the baseboard connector 802 to the PCI connector 804 on the primary riser card should be no longer than approximately 1.4 inches. In a second embodiment, the trace or signal path may be between approximately 0.3 to 1.1 inches in length. The trace length on the peripheral card or PCI card is defined by the PCI Specification, Revision 2.2 for 66 MHz buses. In a first embodiment of the invention, the trace on the peripheral card should be no longer than approximately 2 inches in length. These values are illustrated in FIG. 8B.

Figures 9A, 9B:
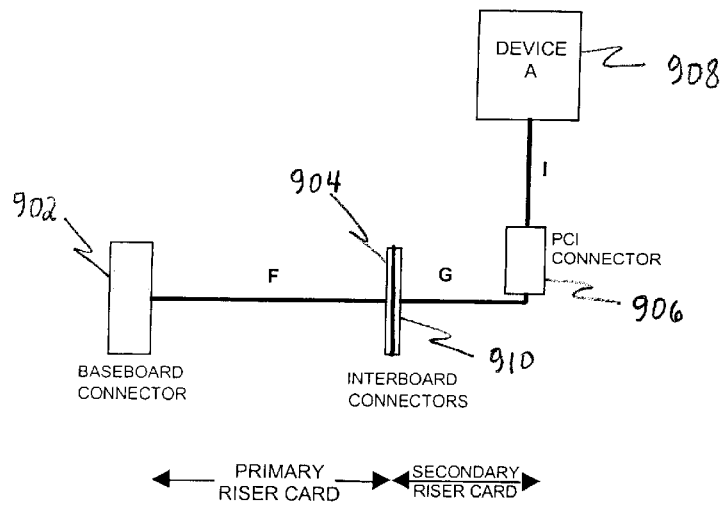
FIG. 9A illustrates a configuration of the secondary riser card of FIG. 4.
FIG. 9B presents a set of trace lengths for the configuration shown in FIG. 9A.

FIG. 9A illustrates the signal transmission paths or traces for a PCI bus from a baseboard connector 902 or PCI socket on a computer board through a primary riser card, without a peripheral card coupled to it, to a secondary riser card with a peripheral device 908 coupled to it. According to one embodiment of the invention, the signal path from the baseboard connector 902 to the interboard connector 904 on the primary riser card may be no longer than approximately 2 inches and preferably between approximately 1 to 1.7 inches in length. The signal path from the interboard connector 910 on the secondary riser card to the PCI connector 906 on the secondary card may be no longer than approximately 1.9 inches and preferably between approximately 0.2 to 1.6 inches in length. The trace length on the peripheral card 908 or PCI card is defined by the PCI Specification, Revision 2.2 for 66 MHz buses and may be no longer than approximately 2 inches in length. These values are illustrated in FIG. 9B.

Figures 10A, 10B:
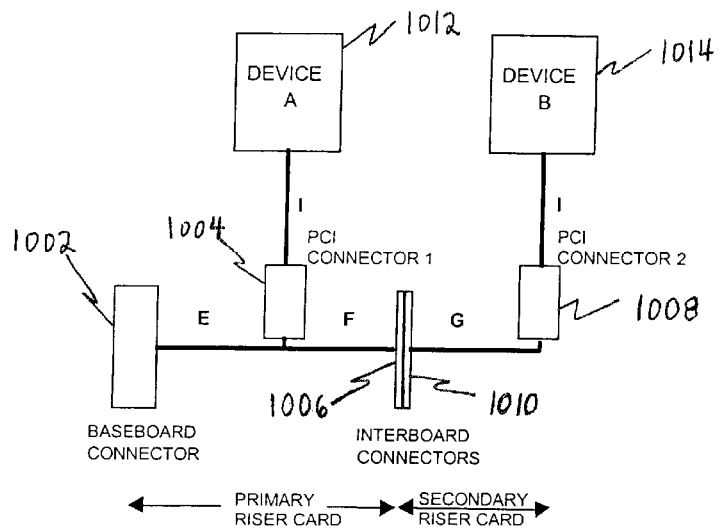
FIG. 10A illustrates a configuration comprising a primary and secondary riser cards.
FIG. 10B presents a set of trace lengths for the configuration shown in FIG. 10A.

FIG. 10A illustrates the signal transmission paths or traces for a PCI bus from a baseboard connector 1002 or PCI socket on a computer board through both a primary riser card and a secondary riser card, each with a peripheral device 1012 and 1014 coupled to it. In one embodiment, the PCI bus operates at 66 MHz. In another embodiment, the PCI sockets on the primary and secondary riser cards are 64-bit PCI sockets. According to one embodiment of the invention, the signal path from the baseboard connector 1002 to the PCI socket 1004 on the primary riser card may be no longer than approximately 1.4 inches and preferably between approximately 0.3 to 1.1 inches in length. According to another embodiment, the signal path from the PCI socket 1004 to the interboard connector 1006 on the primary riser card may be no longer than approximately 1.5 inches and preferably between approximately 0.8 to 1.2 inches in length. In a third embodiment, the trace from the interboard connector 1010 on the secondary riser card to the PCI connector 1008 on the secondary card may be no longer than approximately 1.9 inches and preferably between approximately 0.2 to 1.6 inches in length. These trace lengths values are illustrated in FIG. 10B.

Figures 11A, 11B:
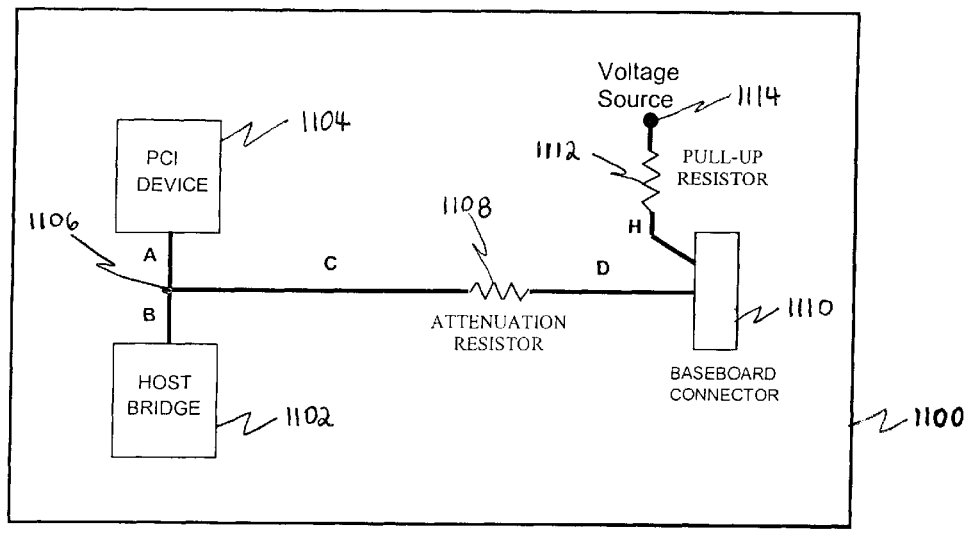
FIG. 11A illustrates a configuration of a circuit board on which the riser cards of FIGS. 8A, 8B, 9A, 9B, 10A, and 10B may be connected.
FIG. 11B presents a set of trace lengths for the configuration shown in FIG. 11A.

FIG. 11A illustrates a circuit board 1100 or computer board with a PCI bus and including a baseboard connector 1110 or PCI socket on which any of the primary and secondary riser card configurations shown in FIGS. 8A, 8B, 9A, 9B, 10A, and 10B may be coupled. This circuit board and components thereon is only one of many systems on which a primary and secondary riser card may be coupled.

As shown, the PCI bus, identified as segments "C" and "D", on the computer board 1100 is defined by the PCI Specification, Revision 2.2 and may include a host bridge 1102 and other PCI devices 1104 which comply with the PCI Specification, Revision 2.2. While a host bridge 1102 and a generic PCI device 1104 are shown in FIG. 11A, this is by way of illustration only and other devices may be employed. For instance, a Small Computer System Interface (SCSI) controller may be coupled to the PCI bus.

According to a first embodiment of the invention, the trace or signal path between the host bridge 1102 and the PCI device 1104 should be a maximum of approximately 2 inches long. A "T" point 1106, defined by the intersection of segments "A", "B", and "C", is selected on this segment such that the trace length from this point to either of the host bridge 1102 and PCI device 1104 is no than approximately 1.2 inches, and preferably no longer than approximately 1 inch, and the total length to the baseboard connector is no more than approximately 8.5 inches, and preferably no longer than 7 inches.

It must be noted that the point at which the host bridge 1102 and PCI device 1104 couple to the PCI bus may be anywhere along segments "C" or "D". That is, any of these devices may be coupled, alone or in combination, to the PCI bus anywhere along the bus without changing the character of the present invention. Additionally, PCI devices 1102 and 1104 need not couple at a "T" point 1106 as shown. In one embodiment, the host bridge 1102 may be coupled to segment "C" while the PCI device 1104 may be coupled to segment "D".

In one embodiment of the invention an attenuation resistor 1108 is placed between the "T" point 1106 and the baseboard connector 1110. The function of the attenuation resistor 1108 is to attenuate reflection from the receivers on peripheral cards or PCI devices when the host-bridge 1102 is driving. According to one embodiment, the trace length from the attenuation resistor 1108 to the baseboard connector 1110 is no more than approximately 2.5 inches, and preferably no longer than approximately 2 inches. The trace length from the resistor 1108 to the "T" point 1106 should be no longer than approximately 6 inches, and preferably no longer than approximately 5 inches. According to one embodiment of the invention, the attenuation resistor 1108 may be less than or equal to approximately 200 Ohms.

In another embodiment, a pull-up resistor 1112 at the baseboard connector 1110 may be present to couple to a voltage source 1114. The stub length from the pull-up resistor 1108 to the baseboard connector 1110 should be a maximum of approximately 1.2 inches, and preferably no longer than 1 inch. According to one embodiment of the invention, the pull-up resistor 1112 is less or equal to approximately 2K Ohms.

Figure 12:
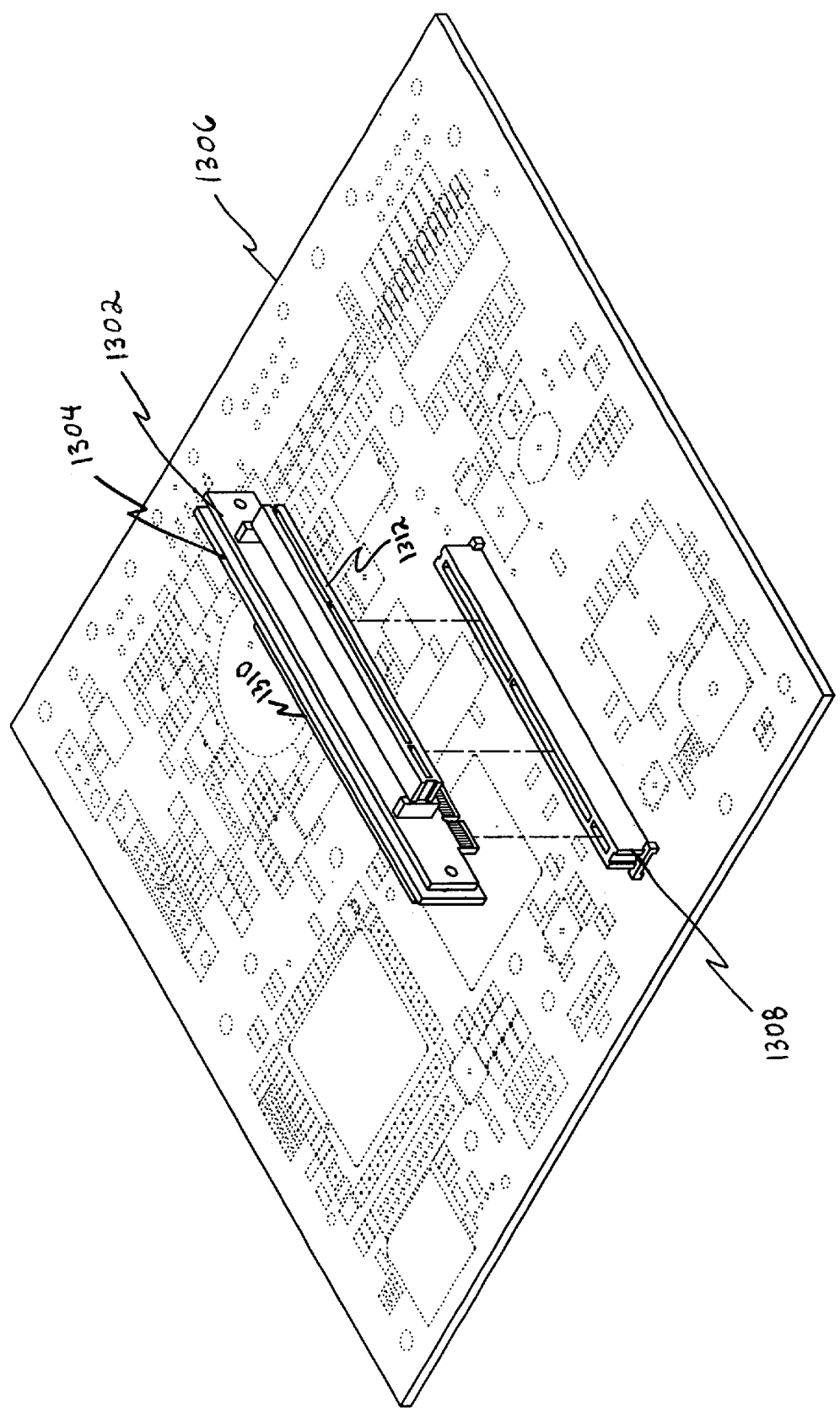
FIG. 12 illustrates an exemplary embodiment of a circuit board onto which a primary and secondary riser cards may be coupled.

FIG. 12 illustrates an exemplary configuration of how a primary riser card 1302 and a secondary riser card 1304 may be coupled to a circuit board 1306. In this embodiment, the secondary riser card 1304 is coupled to the primary riser card 1302. The primary riser card 1302 may be coupled to a socket 1308 on the circuit board 1306. According to this configuration, each riser card 1302 and 1304 may include a socket 1310 and 1312 onto which a peripheral card may be coupled in a position substantially horizontal to the circuit board 1306.

While the invention has been described and illustrated in detail, it is to be clearly understood that this is intended by way of illustration and example only and is not to be taken by way of limitation, the spirit and scope of this invention being limited only by the terms of the following claims.

What is claimed is:

1. A device, comprising:
    a primary riser card substrate including an electrically connecting edge to couple to a bus and an opposite top edge, the primary riser card rising approximately 0.25 inches to 1.75 inches from the connecting edge to the top edge;
    a first socket mounted to a first surface of the primary riser card substrate and electrically coupled to the connecting edge, the first socket mounted substantially longitudinally across the first surface to permit coupling a first peripheral card substantially perpendicular to the first surface to the primary riser card; and
    a first interboard connector mounted to a second surface of the primary riser card and electrically coupled to the primary riser card's connecting edge, the first interboard connector to permit coupling a secondary riser card substantially parallel to the primary riser card and at a level between the electrically connecting edge and the top edge of the primary riser card.

2. The device of claim 1 wherein the connecting edge to couple to a 66 MHz bus.

3. The device of claim 1 wherein the first socket is a 64-bit socket for a 66 MHz bus.

4. The device of claim 1 wherein the electrical path length between the electrically connecting edge and the socket mounted to the first surface is no longer than 1.4 inches.

5. The device of claim 1 wherein the electrical path length between the electrically connecting edge and the first socket mounted to the first surface is in the range of 0.3 inches to 1.1 inches.

6. The device of claim 1 wherein the first interboard connector is capable of transmitting signals of a 66 MHz bus.

7. The device of claim 1 wherein the electrical path length between the electrically conductive edge and the first interboard connector is no longer than 1.5 inches.

8. The device of claim 1 wherein the electrical path length between the electrically conductive finger and the first interboard connector is in the range of 0.8 inches to 1.2 inches.

9. The device of claim 1 further comprising:
    a secondary riser card substrate coupled to the primary riser card, the secondary riser card positioned substantially parallel to the primary riser card and at a level between the electrically connecting edge and top edge of the primary riser card; and
    a second socket mounted substantially longitudinally across a first surface of the secondary riser card substrate and electrically coupled to the connecting edge of the primary riser card, the second socket to permit coupling a second peripheral card substantially perpendicular to the first surface of the secondary riser card and at a level between the electrically connecting edge and top edge of the primary riser card.

10. The device of claim 9 wherein the secondary riser card substrate is less than 1.75 inches across the shortest dimension of the first surface.

11. The device of claim 9 wherein the socket of the secondary riser card is a 64-bit socket for a 66 MHz bus.

12. The device of claim 9 further comprising:
    a second interboard connector electrically coupled to the second socket and to the first interboard connector of the primary riser card to electrically connect the second socket on the secondary riser card substrate to the electrically connecting edge of the primary riser card.

13. The device of claim 12 wherein the electrical path length between the electrically conducting edge on the primary riser card and the first interboard connector on the primary riser card is in the range of 1 inch to 1.7 inches.

14. The device of claim 12 wherein the electrical path length between the second interboard connector on the secondary riser card and the second socket on the secondary riser card is in the range of 0.2 inches to 1.6 inches.

15. The device of claim 9 wherein the electrical path length between the electrically conducting edge on the primary riser card and the second socket on the secondary riser card is no longer than 3.9 inches.

16. The device of claim 9 wherein the electrical path length between the electrically conducting edge on the primary riser card and the second socket on the secondary riser card is in the range of 1 inch to 3.3 inches.

17. A secondary riser card comprising:
    a substrate approximately 0.25 inches to 1.75 inches in height;
    an interboard connector coupled to the one surface of the substrate; and
    a peripheral connector longitudinally coupled to a first surface of the substrate and electrically coupled to the interboard connector, the peripheral connector to permit coupling a first peripheral card substantially perpendicular to the first surface of the secondary riser card.

18. The secondary riser card of claim 17 wherein the peripheral connector is a 64-bit connector for a 66 MHz bus.

19. The secondary riser card of claim 17 wherein the peripheral connector is a 32-bit connector for a 66 MHz Peripheral Component Interconnect bus.

20. The secondary riser card of claim 17 wherein the electrical path length between the interboard connector and the peripheral connector is in the range of 0.2 inches to 1.6 inches.

21. A computer system comprising:
    a circuit board;
    a bus on the circuit board;
    a first socket mounted on the circuit board and electrically coupled to the bus; and a primary riser card of approximately 0.25 inches to 1.75 inches in height, the primary riser card electrically coupled to the first socket on a first electrically connecting edge, the primary riser card further card further including
- a first interboard connector mounted to a second surface of the primary riser card and electrically connecting edge, the first interboard connector to permit coupling a secondary riser card substantially parallel to the primary riser card, and
- a second socket electrically coupled to the first electrically connecting edge, the second socket to permit coupling a first peripheral card substantially perpendicular to the first surface of the primary riser card.

22. The computer system of claim 21 wherein the bus is a 66 MHz Peripheral Component Interconnect bus.

23. The computer system of claim 21 wherein the first and second sockets are 64-bit Peripheral Component Interconnect sockets.

24. The computer system of claim 21 further comprising a host bridge on the circuit board and electrically coupled to the bus.

25. The computer system of claim 24 wherein the electrical path length between the host bridge and the bus is no longer than 1 inch.

26. The computer system of claim 24 wherein the electrical path length between the host bridge and the first socket is no longer than 8 inches.

27. The computer system of claim 24 where-in the electrical path length between the first socket and the second socket is no longer than 1.4 inches.

28. The computer system of claim 21 further comprising;
a secondary riser card substantially parallel to the primary riser card and electrically coupled to the first interboard connector on the primary riser card and including a third socket to couple to a second peripheral card substantially perpendicular to the secondary riser card, the secondary riser card rising approximately 0.25 inches to 1.75 inches above the circuit board.

29. A device comprising:
means for coupling a first riser card to a circuit board and provide a first connector to couple a first peripheral card; and
means for coupling a second riser card to the first riser card and provide a second connector to couple a second peripheral card.

30. The device of claim 29 wherein the primary riser card and secondary riser card are between 0.25 inches and 1.75 inches high.

31. The device of claim 29 wherein the primary riser card and secondary riser card are between 0.50 inches to 1 inch high.

32. The device of claim 29 wherein the first connector on the primary riser card is a 64-bit PCI bus connector.

33. The device of claim 32 wherein the second connector on the secondary riser card is a 64-bit Peripheral Component Interconnect bus connector.

34. The device of claim 32 wherein the second connector on the secondary riser card is a 32-bit Peripheral Component Interconnect bus connector.

35. The device of claim 1, wherein the surface area of the first surface of the primary riser card permits mounting just one such socket on the first surface of the primary riser card.

36. The device of claim 1, wherein the thickness of peripheral cards prevents coupling more than one peripheral card on the first surface of the primary riser card.

* * * * *